United States Patent
Hayashi et al.

(10) Patent No.: US 8,038,835 B2
(45) Date of Patent: Oct. 18, 2011

(54) PROCESSING DEVICE, ELECTRODE, ELECTRODE PLATE, AND PROCESSING METHOD

(75) Inventors: Kazuichi Hayashi, Nirasaki (JP); Kouichi Yatsuda, Isahaya (JP); Masafumi Urakawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/754,372

(22) Filed: Apr. 5, 2010

(65) Prior Publication Data
US 2010/0230386 A1    Sep. 16, 2010

Related U.S. Application Data

(63) Continuation of application No. 10/948,338, filed on Sep. 24, 2004, now abandoned, which is a continuation of application No. PCT/JP03/03769, filed on Mar. 27, 2003.

(30) Foreign Application Priority Data

Mar. 27, 2002  (JP) .................................. 2002-89076

(51) Int. Cl.
*H01L 21/00*    (2006.01)
*C23C 14/00*    (2006.01)
*C23C 16/00*    (2006.01)

(52) U.S. Cl. ............... 156/345.34; 156/345.33; 118/715

(58) Field of Classification Search .................. 118/715; 156/345.33, 345.34
See application file for complete search history.

(56) References Cited

U.S. PATENT DOCUMENTS

| | | | |
|---|---|---|---|
| 5,000,113 A * | 3/1991 | Wang et al. ............... | 118/723 E |
| 5,746,875 A | 5/1998 | Maydan et al. | |
| 5,975,912 A | 11/1999 | Hillman et al. | |
| 6,159,297 A * | 12/2000 | Herchen et al. ............... | 118/708 |
| 6,287,980 B1 | 9/2001 | Hanazaki et al. | |
| 6,758,941 B1 | 7/2004 | Ookawa et al. | |

FOREIGN PATENT DOCUMENTS

| | | |
|---|---|---|
| JP | 62-094938 | 5/1987 |
| JP | 06-120177 | 4/1994 |
| WO | WO00/75973 | 12/2000 |

* cited by examiner

*Primary Examiner* — Ram N. Kackar
(74) *Attorney, Agent, or Firm* — Oblon, Spivak, McClelland, Maier & Neustadt, L.L.P.

(57) ABSTRACT

A processing gas fed from a gas feed pipe (8) through a gas introducing port (9) flows first into an outer annular gas flow channel (20*a*), where it is circumferentially diffused, and then into an inner annular gas flow channel (20*b*) via a passageway (23), and from this inner annular gas flow channel (20*b*) it flows into a gas diffusion gap (7) in the back surface of a shower head (6) via a gas feed hole 25. Thereafter, the processing gas is diffused in the gas diffusion gap (7) and delivered from gas delivery holes (5) to a semiconductor wafer (W). This makes it possible to improve the uniformity of in-plane process, as compared with the prior art, and to make a uniform process.

4 Claims, 5 Drawing Sheets

PROCESSING DEVICE, ELECTRODE, ELECTRODE PLATE, AND PROCESSING METHOD

CROSS-REFERENCE TO RELATED CASES

This application is a continuation of and claims the benefit of priority U.S. application Ser. No. 10/948,338, filed Sep. 24, 2004, the entire contents of which are incorporated herein by reference. U.S. application Ser. No. 10/948,338 is a continuation of International Application PCT/JP03/03769, filed Mar. 27, 2003, which is the International Phase of Japanese application JP 2002-89076, filed Mar. 27, 2002.

TECHNICAL FIELD

The present invention relates to a processing device, an electrode, an electrode plate, and a processing method, including a detection mechanism for optically detecting the processed state of a substrate to be processed.

BACKGROUND ART

Conventionally, in the art of fabrication of semiconductor devices, for example, a processing device is frequently used in order to form the fine circuit structure of a semiconductor device. This processing device generates plasma from a processing gas, so as to perform a process on a desired portion of the semiconductor device by the action of the plasma.

In recent years, a processing device has been developed that includes a detection mechanism for optically detecting the processed state of a substrate to be processed, for example, the thickness of a layer to be etched, or the like, and performs a process on the substrate while detecting the layer thickness or the like, thereby performing the process to a desired result.

FIG. 6 schematically shows the structure of this processing device. As shown in FIG. 6, this processing device includes a cylindrical vacuum chamber that is formed of aluminum, for example, in such a manner that the chamber can be closed airtight. The vacuum chamber forms a processing room.

In the vacuum chamber 1, a placing table (suscepter) 2 is provided for supporting approximately horizontally a semiconductor wafer W as a substrate to be processed in such a manner that the surface to be processed faces upward. The placing table 2 also serves as a lower electrode and is connected to a radio frequency power supply 4 via a matching box 3. This placing table 2 is typically provided with an electrostatic chuck (not shown) for absorbing and holding the semiconductor wafer W, a temperature control system (not shown) for controlling the temperature of the semiconductor wafer W to be at a predetermined temperature, and the like.

On the other hand, a shower head 6 is provided on the ceiling of the vacuum chamber 1 above the placing table 2. The head 6 includes a plurality of gas delivery holes 5 that face the placing surface of the placing table 2 on which the semiconductor wafer W is to be placed. On the back of the shower head 6, a gas diffusion gap 7 is provided.

The ceiling of the vacuum chamber 1 is provided with a gas introducing port 9, to which a gas feed pipe 8 is connected. Under the gas introducing port 9 a circular groove 9a, having a larger diameter than that of the gas introducing port 9, is provided to be in communication with the gas introducing port 9. A baffle plate 11, in the form of a circular disk having a plurality of gas feed holes 10 provided therein, as shown in FIG. 7, is arranged to close the lower opening of the circular groove 9a.

Thus, a predetermined processing gas supplied from the gas feed pipe 8 is introduced into the gas diffusion gap 7 on the back of the shower head 6. The processing gas is introduced from the gas introducing port 9 through the gas feed holes 10 of the baffle plate 11. The processing gas thus introduced is diffused within the gas diffusion gap 7, and is then delivered as uniformly as possible from the respective gas delivery holes 5 toward the semiconductor wafer W.

Moreover, light transmitting windows 12 and 13 formed by light transmitting members are provided at the center of the shower head 6, and in a corresponding region of the ceiling of the vacuum chamber 1, respectively. Through the light transmitting windows 12 and 13, the processed state (layer thickness) of the semiconductor wafer W can be detected by a detection mechanism provided outside the vacuum chamber 1, for example, a layer-thickness detection mechanism 14. The layer-thickness detection mechanism 14 is provided with a driving mechanism 14a for moving the layer-thickness detection mechanism 14 so as to be able to measure the layer thickness in a desired portion of a semiconductor chip.

At the bottom of the vacuum chamber 1 is provided an exhaust port 15, connected to a vacuum exhaust mechanism, which is not shown. Thus, the atmosphere in the vacuum chamber 1 can be set to a predetermined vacuum atmosphere. In addition, in the outside of the sidewall of the vacuum chamber 1, an annular magnetic field generation mechanism 16 is provided. This magnetic field generation mechanism 16 can generate a predetermined magnetic field within the vacuum chamber 1. The magnetic field generation mechanism 16 is provided with a not-shown driving mechanism that can rotate the magnetic field generation mechanism 16 around the vacuum chamber 1.

Thus, a processing device having the aforementioned structure is arranged to uniformly supply a processing gas toward the semiconductor wafer W by distributing the processing gas introduced from the gas introducing port 9 by the components such as the baffle plate 11, the gas diffusion gap 7, and the shower head 6.

However, as described above, in the processing device provided with the layer-thickness detection mechanism 14 for detecting a thickness of a layer on the semiconductor wafer W, or the like, it is necessary to detect the thickness of the layer at the center of the semiconductor wafer W. Thus, the light transmitting windows 12 and 13 for the layer-thickness detection mechanism 14 have to be arranged at the center of the vacuum chamber 1. Consequently the gas introducing port 9 has to be arranged away from the center of the vacuum chamber 1. This makes the process rate of a semiconductor wafer W faster in the region directly below the gas introducing port 9 than in other regions, thus degrading in-plane uniformity of the process.

Moreover, since the light transmitting windows 12 and 13 are provided above the central portion of the semiconductor wafer W, the processing gas cannot be supplied toward the semiconductor wafer W in this region. Thus, the process rate in the central portion of the semiconductor wafer W tends to become lower than that in other regions. This further degrades the in-plane uniformity of the process.

DISCLOSURE OF THE INVENTION

Therefore, it is an object of the present invention to provide a processing device, an electrode, an electrode plate, and a processing method that can improve in-plane uniformity of a process as compared with a conventional technique, and can perform the process uniformly.

According to the present invention, a processing device comprises: a processing room for accommodating a substrate to be processed to perform a predetermined process; a placing table provided in the processing room, the substrate to be processed being placed on the placing table; a gas introducing port to which a gas feed pipe is connected; a shower head provided above the placing table to be opposed to a placing face of the placing table, the shower head having a plurality of gas delivery holes; a gas diffusion gap, provided on an opposite side of the shower head to the placing face, for diffusing a processing gas and delivering the processing gas into the processing room via the gas delivery holes; a light transmitting window provided to be located at a center of the shower head; a detection mechanism for optically detecting a processed state of the substrate to be processed via the light transmitting window; and an annular gas flow channel, formed to be annular with its center located on an axis that is perpendicular to an upper surface of the placing table and passes through the light transmitting window, for diffusing the processing gas introduced from the gas introducing port and then supplying the processing gas to the gas diffusion gap.

The processing device of the present invention is characterized in that the processing device described above further comprises an annular baffle plate provided on a side of the annular gas flow channel that is a closer side to the gas diffusion gap, the annular baffle plate having a plurality of gas feed holes.

The processing device of the present invention is characterized in that the annular gas flow channel, in the processing device described above, includes an outer annular gas flow channel and an inner annular gas flow channel that is in communication with the outer annular gas flow channel.

The processing device of the present invention is characterized in that, in the processing device described above, the gas introducing port is connected to one of the outer annular gas flow channel and the inner annular gas flow channel, and the gas feed holes are provided in a region of the annular baffle plate that corresponds to the other of the outer annular gas flow channel and the inner annular gas flow channel.

The processing device of the present invention is characterized in that the light transmitting window, in the processing device described above, includes gas delivery holes.

The processing device of the present invention is characterized in that, in the processing device described above, the gas delivery holes provided in the light transmitting window are formed with a diameter and a pitch that are the same as those of the gas delivery holes provided in the shower head.

The processing device of the present invention is characterized in that the processing device described above is configured to perform the process on the substrate to be processed while an arranged direction of the gas delivery holes provided in the light transmitting window is inclined at a predetermined angle with respect to an arranged direction of semiconductor chips formed on the substrate to be processed.

According to the present invention, a processing device comprises: a processing room for accommodating a substrate to be processed to perform a predetermined process; a placing table provided in the processing room, the substrate to be processed being placed on the placing table; a shower head, provided above the placing table to be opposed to a placing face of the placing table, the shower head having a plurality of gas delivery holes; a light transmitting window provided to be located at a center of the shower head; a detection mechanism for optically detecting a processed state of the substrate to be processed via the light transmitting window; and gas delivery holes provided in the light transmitting window, wherein a direction of the gas delivery holes formed in the shower head and a direction of the gas delivery holes formed in the light transmitting window are the same and are set in such a manner that all the gas delivery holes in the shower head and all the gas delivery holes in the light transmitting window face the placing face.

The processing device of the present invention is characterized in that, in the processing device described above, the gas delivery holes provided in the light transmitting window are formed with a diameter and a pitch that are the same as those of the gas delivery holes provided in the shower head.

The processing device of the present invention is characterized in that the processing device described above is configured to perform the process on the substrate to be processed while an arranged direction of the gas delivery holes provided in the light transmitting window is inclined at a predetermined angle with respect to an arranged direction of semiconductor chips formed on the substrate to be processed.

According to the present invention, an electrode is provided in a processing device including: a processing room for accommodating a substrate to be processed, to perform a predetermined process; and a placing table provided in the processing room, the substrate to be processed being placed on the placing table. The electrode comprises: a gas introducing port to which a gas feed pipe is connected; a shower head provided above the placing table to be opposed to a placing face of the placing table, the shower head having a plurality of gas delivery holes; a gas diffusion gap, provided on an opposite side of the shower head to the placing face, for diffusing a processing gas and delivering the processing gas into the processing room via the gas delivery holes; a light transmitting window, provided to be located at a center of the shower head, for optically detecting a processed state of the substrate to be processed; and an annular gas flow channel, formed to be annular with its center located on an axis that is perpendicular to an upper surface of the placing table and passes through the light transmitting window, for diffusing the processing gas introduced from the gas introducing port and then supplying the processing gas to the gas diffusion gap.

According to the present invention, an electrode plate is provided in a processing device that includes: a processing room for accommodating a substrate to be processed, to perform a predetermined process; a placing table provided in the processing room, the substrate to be processed being placed on the placing table; a gas introducing port to which a gas feed pipe is connected; a shower head provided above the placing table to be opposed to a placing face of the placing table, the shower head having a plurality of gas delivery holes; a gas diffusion gap, provided on an opposite side of the shower head to the placing face, for diffusing a processing gas and delivering the processing gas into the processing room via the gas delivery holes; a light transmitting window provided to be located at a center of the shower head; a detection mechanism for optically detecting a processed state of the substrate to be processed via the light transmitting window; and an annular gas flow channel, formed to be annular with its center located on an axis that is perpendicular to an upper surface of the placing table and passes through the light transmitting window, for diffusing the processing gas introduced from the gas introducing port and then supplying the processing gas to the gas diffusion gap, wherein the electrode plate is arranged to cover a surface of the shower head and to be attachable to and detachable from the shower head freely, the surface of the shower head being opposed to the placing face.

According to the present invention, a processing method uses a processing device that includes: a processing room for accommodating a substrate to be processed to perform a predetermined process; a placing table provided in the processing room, the substrate to be processed being placed on the placing table; a shower head provided above the placing table to be opposed to a placing face of the placing table, the shower head having a plurality of gas delivery holes; and a detection mechanism for optically detecting a processed state of the substrate to be processed via a light transmitting window provided to be located at a center of the shower head, the light transmitting window having gas delivery holes provided therein, wherein a direction of the gas delivery holes formed in the shower head and a direction of the gas delivery holes formed in the light transmitting window are the same and are set in such a manner that all the gas delivery holes in the shower head and all the gas delivery holes in the light transmitting window face the placing face and wherein the process is performed on the substrate to be processed while an arranged direction of the gas delivery holes provided in the light transmitting window is inclined at a predetermined angle with respect to an arranged direction of semiconductor chips formed on the substrate to be processed.

BEST MODE FOR CARRYING OUT THE INVENTION

Figure 1:
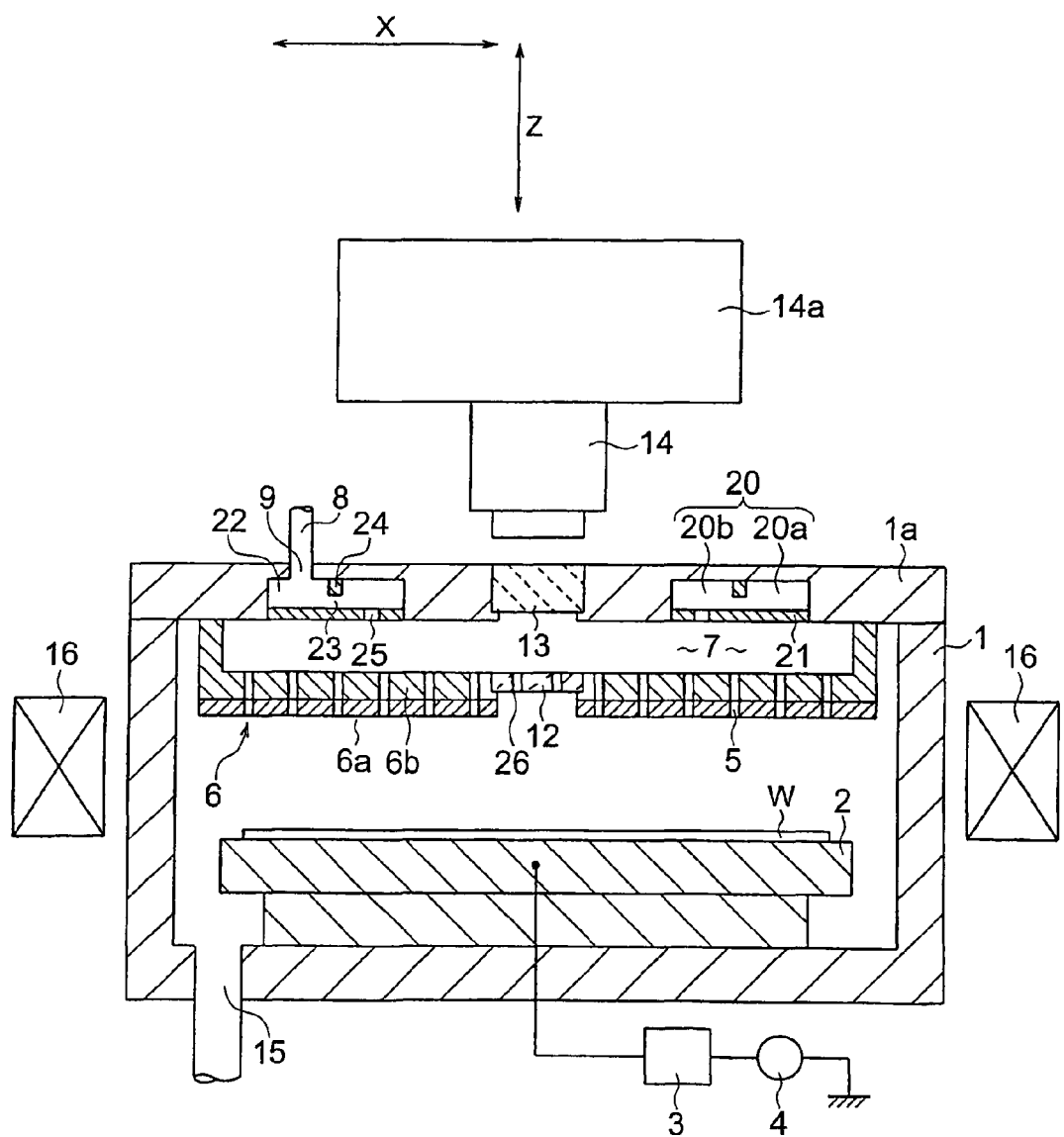
FIG. 1 schematically shows the configuration of a processing device according to an embodiment of the present invention.
Figure 6:
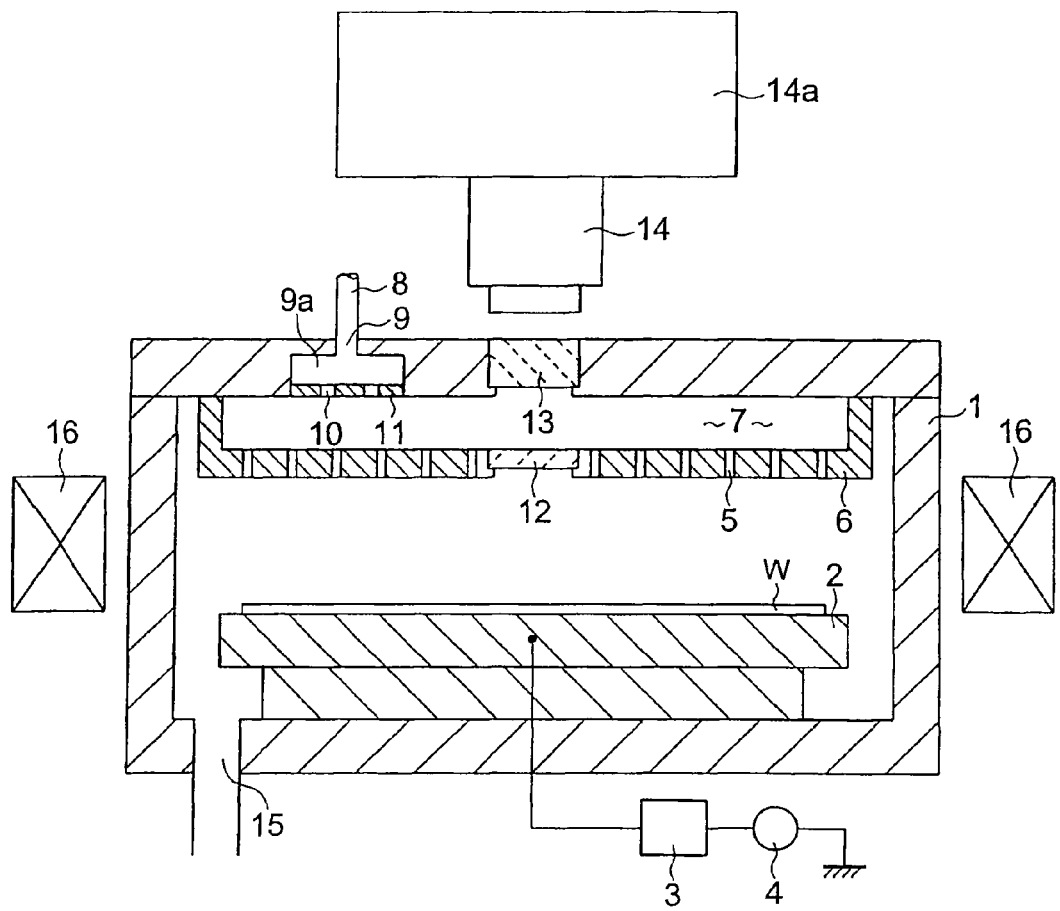
FIG. 6 schematically shows the configuration of a conventional processing device.
Figure 7:
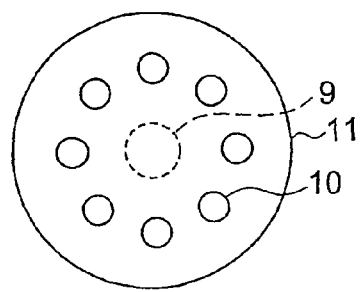
FIG. 7 shows a main part of the processing device shown in FIG. 6.

Embodiments of the present invention are now described in detail with reference to the drawings. FIG. 1 schematically shows the configuration of a processing device according to an embodiment where the present invention is applied to an etching process. In FIG. 1, the same parts as those appearing in FIG. 6 are labeled with the same reference numerals, while the redundant description is omitted.

Figure 2:
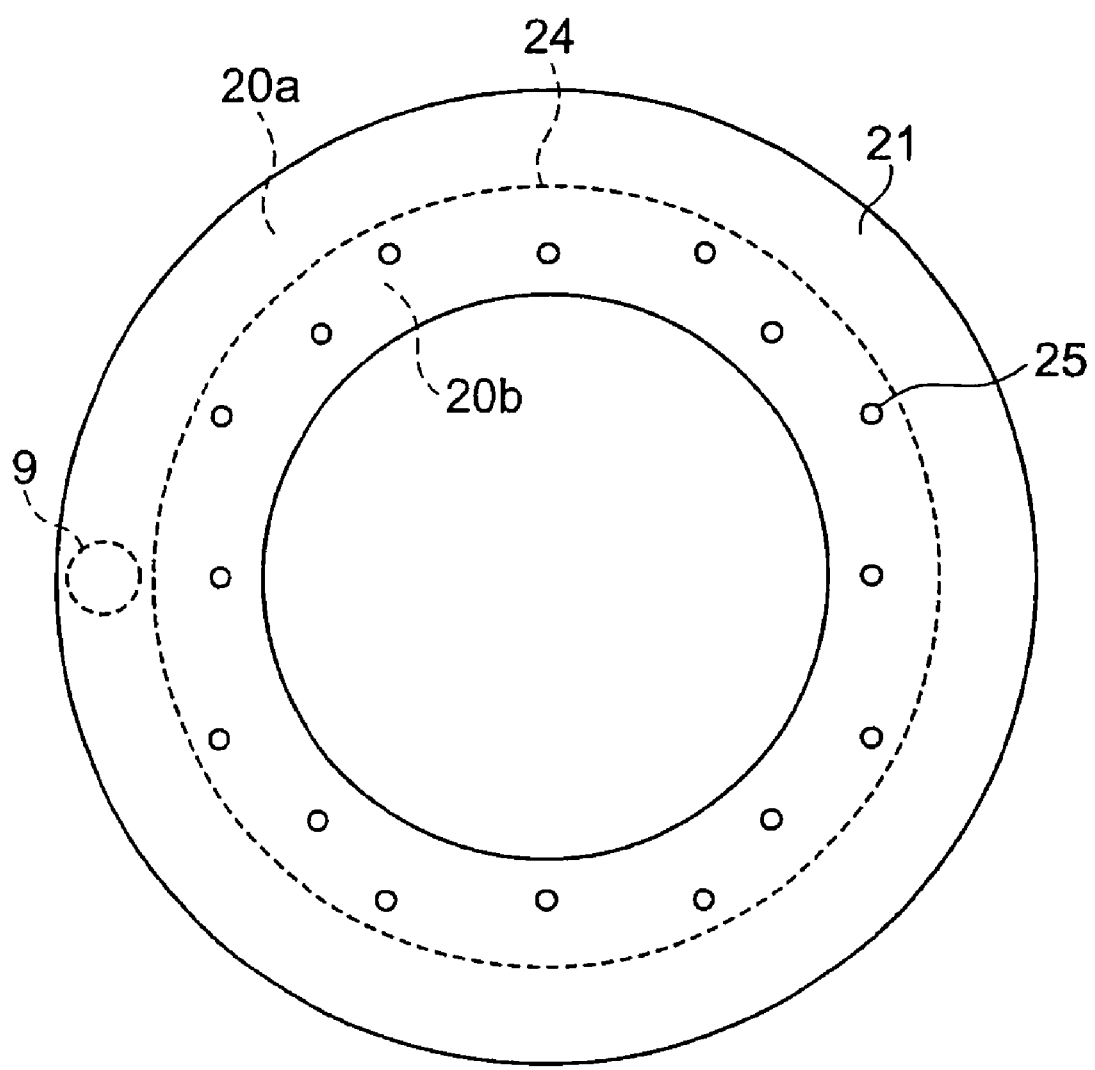
FIG. 2 shows a main part of the processing device shown in FIG. 1.

As shown in FIG. 1, in the processing device of the present embodiment, an annular gas groove 22 is formed on an inner side face of a cover 1a. This cover 1a is in the form of a circular disk that closes the upper opening of a cylindrical vacuum chamber 1 in an airtight manner, and forms the ceiling of the vacuum chamber 1. Under the annular gas groove 22 is provided an annular baffle plate 21 which is formed to be annular, as shown in FIG. 2. Thus, an annular gas flow channel 20 for etching gas is formed between the annular groove 22 and the annular baffle plate 21. An upper electrode of the processing device is formed by the circular disk-like cover 1a and a shower head 6 that includes an electrode plate 6a and an electrode supporting body 6b. The electrode plate 6a is provided to cover the surface of the electrode that faces a placing table 2. The electrode plate 6a can be freely attached to, and detached from, the electrode. Thus, when the electrode plate 6a is consumed as a consequence of plasma etching or the like, it is possible to replace only the electrode plate 6a by detaching the electrode plate 6a from the electrode supporting body 6b.

The aforementioned annular gas flow channel 20 is arranged in such a manner that light transmitting windows 12 and 13 are located at the center of the annular gas flow channel 20, i.e., they are arranged concentrically with respect to the annular gas flow channel 20. In other words, the annular gas flow channel 20 is formed with its center located on an axis that is perpendicular to the upper surface of the placing table 2, and passes through the light transmitting windows 12 and 13.

The annular gas flow channel 20 has a double groove structure formed by an outer annular gas flow channel 20a, and an inner annular gas flow channel 20b, both concentrically formed to be in close proximity with each other. A convex portion 24 is provided between the outer annular gas flow channel 20a and the inner annular gas flow channel 20b, forming in conjunction with the annular baffle plate 21 a passageway 23 therebetween.

A gas introducing port 9 is provided in a region where the outer annular gas flow channel 20a is present, and is connected to a gas feed pipe 8. Additionally, a plurality of gas feed holes 25 are provided in a region of the annular baffle plate 21 that corresponds to the inner annular gas flow channel 20b. The relationship of positions between the gas introducing port 9 and the gas feed holes 25 may be reversed, for example, in such a manner that the gas introducing port 9 to which the gas feed pipe 8 is connected is provided in a region of the inner annular gas flow channel 20b, while the gas feed holes 25 are provided in a region of the annular baffle plate 21 that corresponds to the outer annular gas flow channel 20a.

The gas feed holes 25 are provided on the annular baffle plate 21 in a circumferential direction, and with a predetermined pitch. In the present embodiment, the gas feed holes 25 are staggered in two lines, as shown in FIG. 2. Please note that the arrangement, the number and the like, of the gas feed holes 25 can be determined in any manner as long as a processing gas can be supplied from the gas feed holes 25 as uniformly as possible.

Moreover, in the present embodiment the annular gas flow channel 20 has a double groove structure, formed by the outer annular gas flow channel 20a and the inner annular gas flow channel 20b, and with the passageway 23 provided therebetween as described above. However, in a case where gas can be sufficiently diffused within the annular gas flow channel 20 due to a relationship with conductance and the like of the gas feed hole 25 provided in the annular baffle plate 21, the annular gas flow channel 20 may be formed by a single annular gas flow channel instead of the above double groove structure.

Furthermore, in the present embodiment, one of the light transmitting windows 12 and 13 provided for a layer-thickness detection mechanism 14, i.e., the light transmitting window 12 provided in the shower head 6, is provided with a plurality of gas delivery holes 26.

Figure 3:
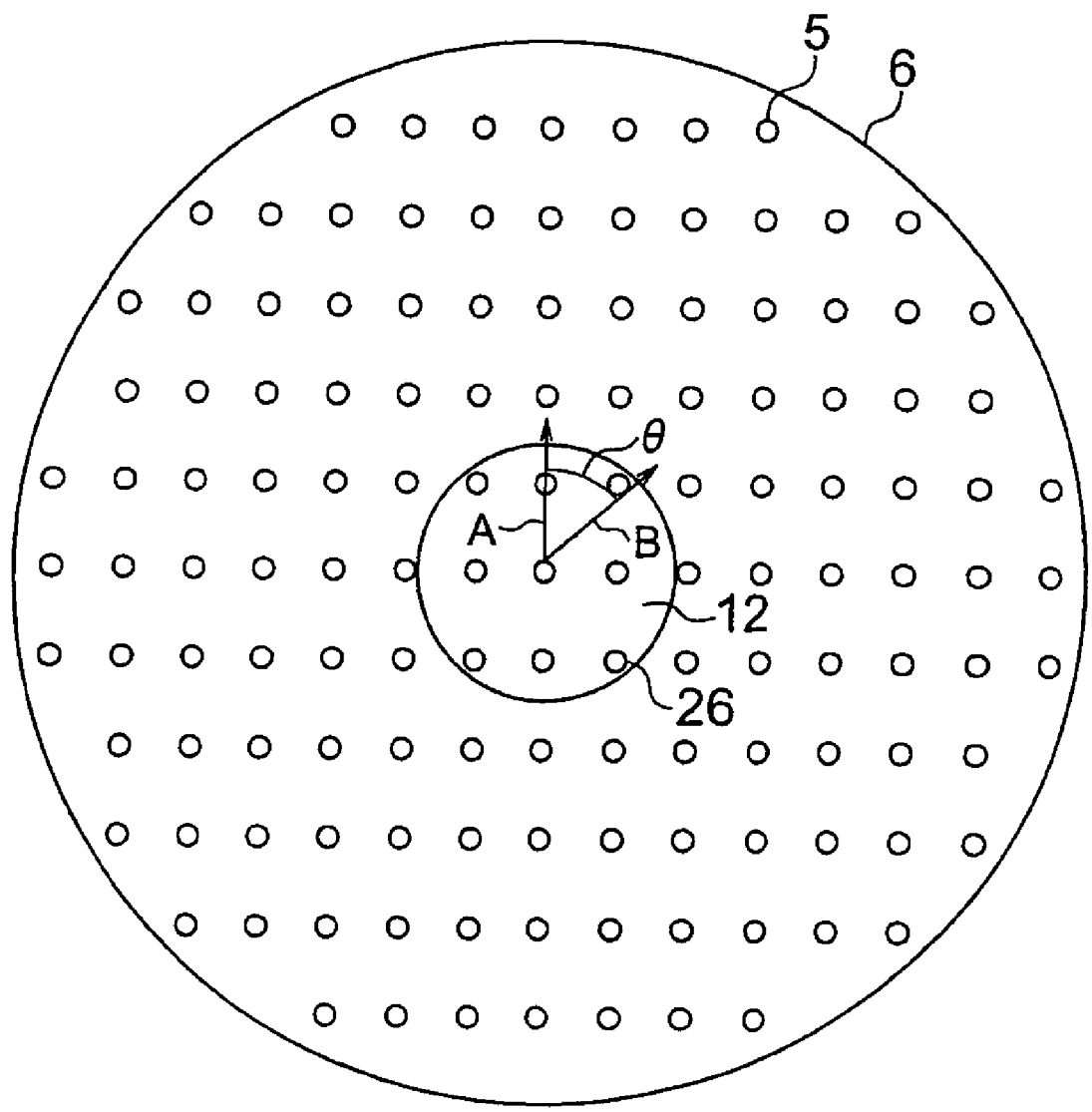
FIG. 3 shows a main part of the processing device shown in FIG. 1.

As shown in FIG. 3, those gas delivery holes 26 are provided with a diameter and a pitch that are the same as those of the gas delivery holes 5 provided in the shower head 6. In the region around the center of a semiconductor wafer W, the processing gas is supplied toward the semiconductor wafer W through those gas delivery holes 26.

In the present embodiment the positions of the gas delivery holes 26, and the alignment direction of the semiconductor wafer W when the semiconductor wafer W is placed on the placing table 2, are controlled in such a manner that the arranged direction of the gas delivery holes 26 (shown with the arrow A in FIG. 3) is inclined at a predetermined angle θ with respect to the arranged direction of semiconductor chips on the semiconductor wafer W (shown with the arrow B in FIG. 3).

In the present embodiment, in which the processing device has the aforementioned configuration, the processing gas supplied from the gas feed pipe 8 through the gas introducing port 9 first flows into the outer annular gas flow channel 20*a*. It is then diffused within the outer annular gas flow channel 20*a* along its circumferential direction. Then, the processing gas enters the inner annular gas flow channel 20*b*, via the passageway 23, and then enters the gas diffusion gap 7 on the back side of the shower head 6 through the gas feed holes 25.

Thus, at the time when the processing gas has entered the gas diffusion gap 7, the processing gas has been already diffused along the annular gas flow channel 20 to some extent. Moreover, the processing gas is delivered through the respective gas delivery holes 5 toward the semiconductor wafer W while the processing gas is also diffused within the gas diffusion gap 7. Therefore, it is possible to uniformly supply the sufficiently diffused processing gas to the semiconductor wafer W.

In addition, when the processing gas is supplied to the semiconductor wafer W, the supply of processing gas is performed not only through the gas delivery holes 5 provided in the shower head 6 but also through the gas delivery holes 26 provided in the light transmitting window 12. Therefore, even in the central region of the semiconductor wafer W, it is possible to uniformly supply the processing gas as for other regions of the semiconductor wafer W.

Furthermore, the positions of the gas delivery holes 26, and the alignment direction of the semiconductor wafer W when the semiconductor wafer W is placed on the placing table 2, are controlled in such a manner that the arranged direction of the gas delivery holes 26 forms a predetermined angle θ with respect to the arranged direction of the semiconductor chips on the semiconductor wafer W. Thus, during measurement of a thickness of a layer on the semiconductor wafer W is by layer-thickness detection mechanism 14, even if the optical path of light for thickness measurement by the layer-thickness detection mechanism 14 overlaps the gas outlet 26, thereby preventing the thickness measurement, it is possible to move the layer-thickness detection mechanism 14 by a driving mechanism 14*a* and perform the thickness measurement on an adjacent semiconductor chip or the like, on the semiconductor wafer W.

Figure 4:
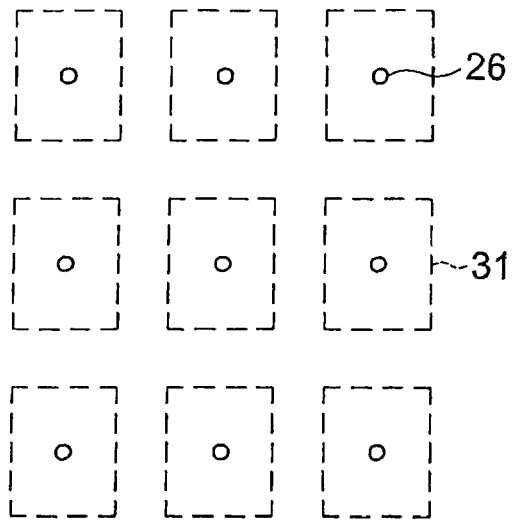
FIG. 4 is a diagram of a positional relationship between chips on a semiconductor wafer and gas delivery holes.

On the other hand, a case is considered in which the arranged direction of the gas delivery holes 26 is coincident with the arranged direction of the semiconductor chips on the semiconductor wafer W. In this case, if the pitch of the gas delivery holes 26 is the same as that of the semiconductor chips on the semiconductor wafer W, when the layer-thickness detection mechanism 14 is moved by the driving mechanism 14*a* to an adjacent semiconductor chip so as to perform the thickness measurement for the adjacent semiconductor chip, the gas outlet 26 may still overlap the portion of the adjacent semiconductor chip to be measured. Once again the thickness measurement will be prevented. FIG. 4 shows that state, wherein 31 denotes a single semiconductor chip on the semiconductor wafer W.

Figure 5:
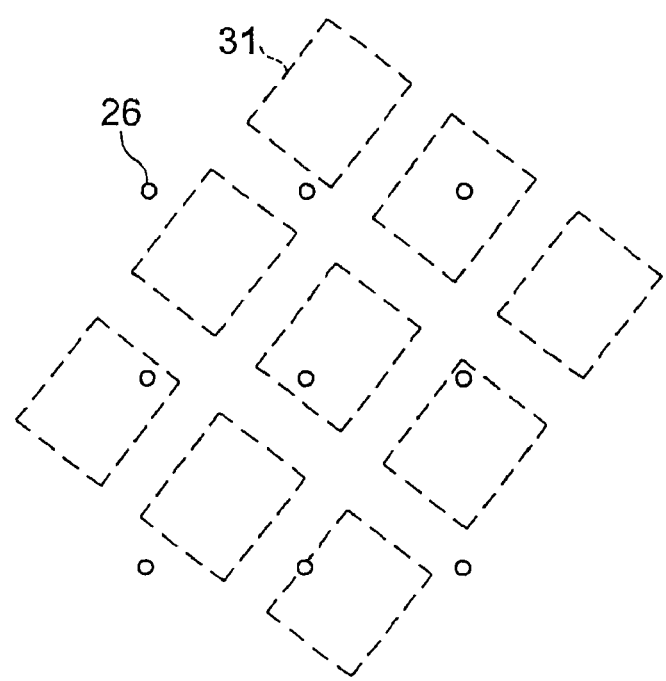
FIG. 5 is a diagram of a positional relationship between the chips on the semiconductor wafer and the gas delivery holes according to a desired embodiment of the present invention.

The aforementioned relationship, between the arranged direction of the gas delivery holes 26 and the arranged direction of the semiconductor chips on the semiconductor wafer W, can be solved by arranging in advance an alignment direction of the semiconductor wafer W, which is placed on the placing table 2, away from the fixed arranged direction of the gas delivery holes 26, as shown in FIG. 5. Moreover, in a case where the alignment direction of the semiconductor wafer W placed on the placing table 2 has been already determined, that relationship can also be solved by fixing the shower head 6 in advance in such a manner that the arranged direction of the gas delivery holes 26 is inclined at a predetermined angle with respect to the arranged direction of the semiconductor chips on the semiconductor wafer W.

The driving mechanism 14*a* is a mechanism for driving and moving the layer-thickness detection mechanism 14. The driving mechanism 14*a* and the layer-thickness detection mechanism 14 have to be moved from a space above the vacuum chamber 1 to a predetermined escape position when, for example, maintenance or the like is performed. Thus, the driving mechanism 14*a* is configured to be movable in a Z direction (vertical direction) and an X direction (horizontal direction), as shown with arrows in FIG. 1, by a Z-direction moving mechanism and an X-direction moving mechanism respectively (both not shown).

When the driving mechanism 14*a* and the layer-thickness detection mechanism 14 are moved from a measurement position above the vacuum chamber 1 to the escape position, it is necessary to move them upward (in the Z direction) and then in the horizontal direction (in the X direction), otherwise they may come in contact with the surrounding structure. Similarly, when the driving mechanism 14*a* and the layer-thickness detection mechanism 14 are moved from the escape position to the measurement position located above the vacuum chamber 1, it is necessary to first move them in the horizontal direction (in the X direction) and then move them downward (in the Z direction), otherwise they may come in contact with the surrounding structure.

Thus, the Z-direction and X-direction moving mechanisms mentioned above are each provided with a stopper mechanism. They are configured in such a manner that the stopper mechanism of the Z-direction moving mechanism is unlocked, so as to allow the driving mechanism 14*a* and the layer-thickness detection mechanism 14 to move in Z direction, when they reach a predetermined position on the X-direction moving mechanism (i.e. above the measurement position). The stopper mechanism of the X direction moving mechanism is unlocked so as to allow the driving mechanism 14*a* and the layer-thickness detection mechanism 14 to move in the X direction when they reach a predetermined position on the Z-direction moving mechanism (i.e. a position at which they have been moved up).

Next, a procedure for etching using the aforementioned processing device is described. First, a gate valve (not shown) is opened and a semiconductor wafer W is carried into the vacuum chamber 1 by a transfer mechanism, or the like, through the gate valve. The semiconductor wafer W is placed on the placing table 2. Then, the semiconductor wafer W is attracted and held on the placing table 2 by an electrostatic chuck or the like (not shown). After the transfer mechanism has been moved to the outside of the vacuum chamber 1, the gate valve is closed.

Then, the vacuum chamber 1 is evacuated through the exhaust port 15 by a vacuum pump (not shown).

After the inside of the vacuum chamber 1 has reached a predetermined degree of vacuum, a predetermined processing gas is introduced, at a predetermined flow rate, into the vacuum chamber 1 through the gas feed pipe 8. The inside of the vacuum chamber 1 is maintained at a predetermined pressure, for example, 1.33 to 133 Pa (10 to 1000 mTorr).

In this state, a radio frequency power at a predetermined frequency, for example a frequency of 13.56 MHz, is supplied to the placing table 2 from the radio frequency power supply 4.

In this case, because of the application of radio frequency power to the placing table 2 serving as a lower electrode, a radio frequency electric field is generated in the processing space between the shower head 6 serving as an upper electrode and the placing table 2. Also, a magnetic field is generated by the magnetic field generation mechanism 16. In this state, a process using plasma can be performed.

During the etching process, the processing gas is uniformly supplied to the entire semiconductor wafer W, as described above. Thus, the etching process is performed uniformly for the entire surface of the semiconductor wafer W.

The etching process is performed while the thickness of a predetermined layer, on a predetermined portion around the center of the semiconductor wafer W, is measured. When the measured thickness reaches a predetermined thickness and therefore it has been detected that a predetermined etching process has been done, the supply of the radio frequency power from the radio frequency power supply 4 is stopped so as to halt the etching process. Then, the semiconductor wafer W is carried out from the vacuum chamber 1 in a reverse procedure to the aforementioned carry-in procedure.

As described above, in the present embodiment, even in a case where the light transmitting windows 12 and 13 for the layer-thickness detection mechanism 14 are provided at the center of the processing device, it is possible to uniformly supply the processing gas to the entire surface of the semiconductor wafer W. Thus, it is possible to uniformly perform a process on the entire surface of the semiconductor wafer W.

The processing device that supplies the radio frequency power to the placing table 2 serving as the lower electrode has been described in the above embodiment. However, the present invention is not limited thereto. For example, the present invention can be also applied to a type of processing device that supplies the radio frequency power to the upper electrode, and to a type of processing device that applies a radio frequency voltage to both the upper and lower electrodes. Moreover, the present invention can be applied not only to an etching apparatus and an etching method but also to a plasma CVD apparatus and a plasma CVD processing method.

As described above, according to the processing device, electrode, electrode plate, and processing method of the present invention, the in-plane uniformity of the process can be improved as compared with a conventional technique. Thus, the process can be performed uniformly.

INDUSTRIAL APPLICABILITY

A processing device, an electrode, an electrode plate, and a processing method according to the present invention can be used in the semiconductor manufacturing industry that manufactures semiconductor devices, and the like.

Thus, the present invention has an industrial applicability.

The invention claimed is:

1. A processing device comprising:
a processing room for accommodating a substrate to be processed to perform a predetermined process, the processing room comprising a cylindrical vacuum chamber and a disk-shaped cover arranged to close the cylindrical vacuum chamber;
a placing table provided in the processing room, the substrate to be processed being placed on the placing table;
a gas introducing port to which a gas feed pipe is connected;
a shower head provided in the cylindrical vacuum chamber below the disk-shaped cover and above the placing table to be opposed to a placing face of the placing table, the shower head comprising an electrode supporting body having a first plurality of gas delivery holes and an electrode plate having a second plurality of gas delivery holes corresponding to the first plurality of gas delivery holes, the electrode plate being replaceably coupled to a side of the electrode supporting body which is opposed to the placing face of the placing table such that the electrode plate is opposed to the placing face and the first plurality of gas delivery holes are aligned with the second plurality of gas delivery holes;
a gas diffusion gap, provided on an opposite side of the shower head to the electrode plate, for diffusing a processing gas and delivering the processing gas into the processing room via the gas delivery holes;
a light transmitting window provided to be located at a center of the shower head, the light transmitting window comprising a first window coupled to a center area of the disk shaped cover, and a second window coupled to a center area of the electrode supporting body, the second window including gas delivery holes consistent with holes in the electrode plate;
a detection mechanism for optically detecting a processed state of the substrate to be processed, the detection mechanism being arranged outside the processing room and in optical line of sight of the substrate via the light transmitting window;
an annular gas flow channel, formed to be annular with its center located on an axis that is perpendicular to an upper surface of the placing table and which passes through the light transmitting window, the annular gas flow channel being built in the disk shaped cover with the gas diffusion gap interposed between the annular gas flow channel and the shower head such that the annular gas flow channel diffusing the processing gas introduced from the gas introducing port and then supplying the processing gas to the gas diffusion gap; and
an annular baffle plate provided on a side surface of the annular gas flow channel that is closer to the gas diffusion gap, the annular baffle plate having a plurality of gas feed holes, wherein:
each of the first and second plurality of the gas feed holes are staggered in two circumferential paths,
the annular gas flow channel comprises an outer annular gas flow channel and an inner annular gas flow channel that is in communication with the outer annular gas flow channel, the outer and inner annular gas flow channel being separated by an annular convex portion projecting downward from a ceiling of the annular gas channel toward the baffle plate, and
the gas introducing port is connected to one of the outer annular gas flow channel and the inner annular gas flow channel, and the gas feed holes are provided in a region of the annular baffle plate that corresponds to the other of the outer annular gas flow channel and the inner annular gas flow channel.

2. The processing device according to claim 1, wherein the light transmitting window comprises gas delivery holes.

3. The processing device according to claim 2, wherein the gas delivery holes provided in the light transmitting window are formed with a diameter and a pitch that are the same as those of the gas delivery holes provided in the shower head.

4. The processing device according to claim 2, wherein the processing device is configured to perform the process on the substrate to be processed while an arranged direction of the gas delivery holes provided in the light transmitting window is inclined at a predetermined angle with respect to an arranged direction of semiconductor chips formed on the substrate to be processed.

* * * * *